United States Patent [19]

Takahashi et al.

[11] Patent Number: 4,621,255
[45] Date of Patent: Nov. 4, 1986

[54] METHOD AND APPARATUS FOR ANALOG-TO-DIGITAL CONVERSION

[75] Inventors: Minoru Takahashi; Koichi Kano, both of Hyogo; Kan Otsuka, Aichi, all of Japan

[73] Assignees: Fujitsu Ten Limited, Hyogo; Toyota Jidosha Kabushiki Kaisha, Aichi, both of Japan

[21] Appl. No.: 663,460

[22] Filed: Oct. 22, 1984

[30] Foreign Application Priority Data

Oct. 20, 1983 [JP] Japan ................................ 58-197354

[51] Int. Cl.⁴ ............................................. H03K 13/02
[52] U.S. Cl. ........................ 340/347 AD; 340/347 NT
[58] Field of Search .................. 340/347 AD, 347 NT

[56] References Cited

U.S. PATENT DOCUMENTS

| | | | |
|---|---|---|---|
| 3,368,149 | 2/1968 | Wasserman | 340/347 NT |
| 4,024,533 | 5/1977 | Neumann | 340/347 NT |
| 4,191,942 | 3/1980 | Long | 340/347 AD |
| 4,268,820 | 5/1981 | Hareyama | 340/347 NT |

FOREIGN PATENT DOCUMENTS

56-6654 2/1981 Japan.
56-22169 5/1981 Japan.

*Primary Examiner*—Vit W. Miska
*Attorney, Agent, or Firm*—Wenderoth, Lind & Ponack

[57] ABSTRACT

One analog signal is selected out of a plurality of analog signals by a multiplexer and a capacitor is electrically charged though such a switch as adapted to be closed/opened by a start signal, and thereafter the capacitor is caused to discharge with a constant current with the switch opened. A level discriminating signal is led out when a voltage of the capacitor discharging goes below a predetermined discriminating level after the switch is opened. A stop signal is generated as a result of a logical operation of the analog signal and the level discriminating signal by an AND gate. A processing circuit accepts the stop signal and calculates a digital value corresponding to a time period from the time that the switch is opened to the time that the level discriminating signal is generated, and then moves to a subsequent processing operation.

12 Claims, 13 Drawing Figures

METHOD AND APPARATUS FOR ANALOG-TO-DIGITAL CONVERSION

BACKGROUND OF THE INVENTION

1. Field of the Invention

This invention relates generally to an analog-to-digital converter for converting an analog signal into a digital signal, and more particularly to method and apparatus for analog-to-digital conversion by utilization of charging and discharging actions of a capacitor.

2. Description of the Prior Art

Figure 1:
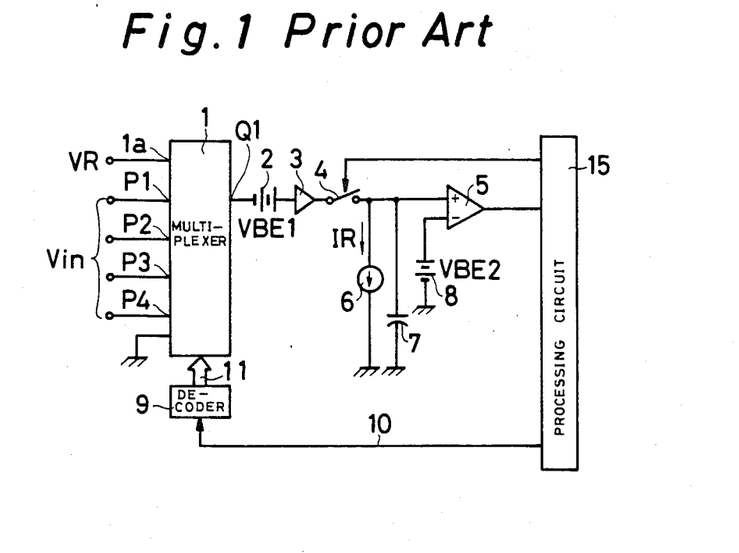
FIG. 1 is an electric circuit diagram showing the Prior Art analog-to-digital converting method.

In a typical analog-to-digital converter, a capacitor is electrically charged by an input signal until a value of an output voltage thereof reaches a specified one corresponding to the input signal, and thereafter the capacitor is caused to discharge until the value of the output voltage thereof decreases to a predetermined one. The time it takes for the value of the output voltage to change from the specified one to the determined one is measured by counting clock pulses or by other means, and this time is digitized. One of such conventional analog-to-digital converters is shown in FIG. 1, in which a reference voltage VR is applied to an input terminal $1a$ of a multiplexer 1. To other input terminals P1 through P4 is applied an analog voltage of an analog signal from a sensor for detecting a physical quantity or the like. An output terminal Q1 of the multiplexer 1 is connected to the negative pole of a battery cell 2, of which positive pole is connected to a noninverting input terminal of a comparator 5 by way of a buffer gate 3 and a switch 4. The noninverting input terminal of the comparator 5 is grounded through a constant current source 6, and is also grounded through the capacitor 7. An inverting input terminal of the comparator 5 is connected to the positive pole of a battery cell 8 for applying a reference voltage. A decoder 9 receives a channel selection signal through lines 10, and transmits the decoder signal to the multiplexer 1 through a bus line 11. The analog voltage applied to the input terminals P1 to P4 of the multiplexer 1 is successively sent out from the output terminal Q1 of the multiplexer 1 by the channel selection signal sent out in the lines 10 from a processing circuit 15. The analog voltage sent out from the output terminal Q1 is synthesized with a voltage VBE1 for permitting this analog voltage of any one of 0 V into a digital signal, and the capacitor 7 is charged during the low level period of a start signal for starting the analog-to-digital converting operation from the processing circuit 15. While the start signal is at a low level, the switch 4 is closed.

After completion of charging the capacitor 7, the processing circuit 15 raises the level of the start signal to be high and the switch 4 is opened, so that the capacitor 7 is discharged with a constant current IR. The voltage of the capacitor 7 is compared with a voltage VBE2 applied to the inverting input terminal by the comparator 5, of which output terminal converts an analog voltage into a digital voltage and transmits a stop signal to show that the conversion is over.

Figure 2:
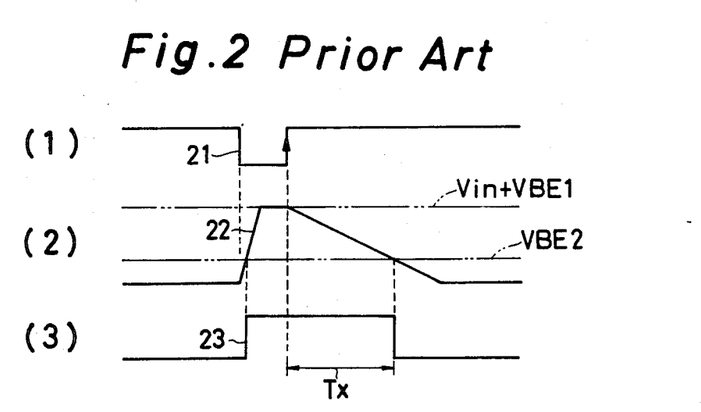
FIG. 2 is a wave-form diagram explaining the operation of the electric circuit of FIG. 1.

FIG. 2 is a timing chart of start signal and stop signal in FIG. 1. When a start signal 21 shown in diagram (1) of FIG. 2 descends to a low level, the voltage of the capacitor 7 begins to rise as indicated by line 22 in diagram (2) corresponding to the magnitude of input analog voltage Vin and bias voltage VBE1 and reaches a specified value (=Vin+VBE1). When this capacitor voltage reaches VBE2, a stop signal 23 rises to a high level as shown in diagram (3). When the start signal 21 returns to the high level, the switch 4 is opened, and the voltage of the capacitor 7 declines, and when the voltage thereof dropping below voltage VBE2, the stop signal 23 turns from the high level to a low level.

Measuring the time Tx from the rise of start signal 21 to the fall of stop signal 23, the input voltage Vin which is an analog voltage applied to the input terminals P1 to P4 of the multiplexer 1 may be calculated in the following equation.

$$(Vin + VBE1 - VBE2) \times C = IR \times Tx \qquad (1)$$

Where C is the capacity of capacitor 7. Changing the input voltage Vin to a reference voltage VR and leading out to output terminal Q1 yields Eq. (2).

$$(VR + VBE1 - VBE2) \times C = IR \times TR \qquad (2)$$

Where TR is the time from rise of start signal 21 to fall of stop signal 23.

Eq. (3) is established when VR is 0 volt (VBE1 — VBE2).

$$(VBE1 - VBE2) \times C = IR \times TO \qquad (3)$$

Where TO is the time from rise of start signal 21 till fall of stop signal 23 when VR is 0 volt. From Eqs. (1) to (3), Eq. (4) is obtained.

$$\frac{Vin}{VR} = \frac{Tx - TO}{TR - TO} \qquad (4)$$

Where VR, Tr, and TO are predetermined values. Therefore, when the time Tx is measured, the digital value of the input voltage Vin may be calculated from Eq. (4).

Figure 3:
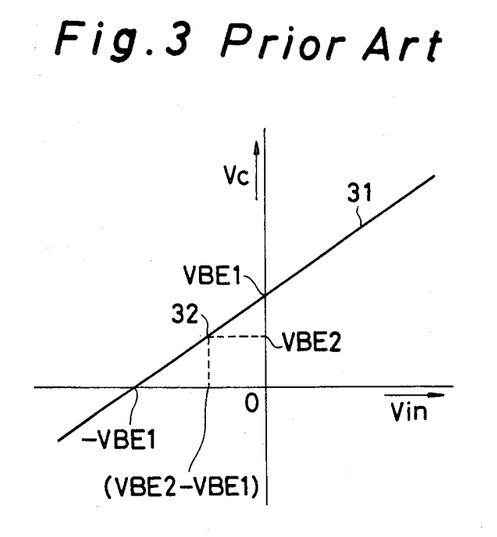
FIG. 3 is another diagram explaining the operation of the electric circuit of FIG. 1.

FIG. 3 is a graph showing the relation between said input voltage Vin and a voltage Vc of the capacitor 7. The line indicated by number 31 expresses Eq. (5).

$$Vc = Vin + VBE1 \qquad (5)$$

Figure 4:
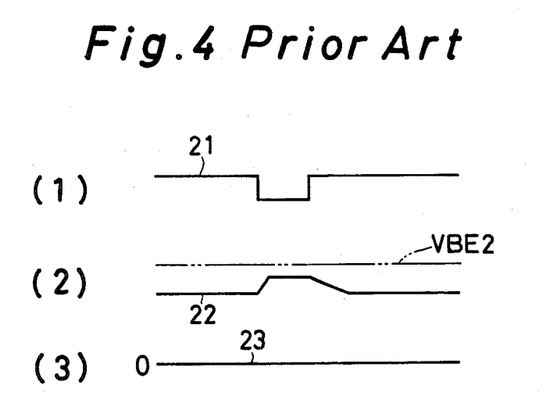
FIG. 4 is a diagram of timing chart when the electric circuit of FIG. 1 is not activated.

At point 32 on line 31, the voltage Vc is at the level of voltage VBE2, and when the charging voltage Vc of capacitor 7 is above the reference voltage VBE2, an analog-to-digital conversion is possible, but when the input voltage Vin between the sensor and processing circuit becomes less than (VBE2−VBE1) (a negative voltage) due to the effect of noise or fluctuation of earth voltage, the charging voltage Vc becomes less than the voltage VBE2 and a stop signal is not generated, so that a fall waveform is not given to the processing circuit 15 by the comparator 5. The processing circuit 15 is adapted in such a manner as to operate the input voltage Vin based on Eq. (4) depending on the fall waveform from the comparator 5, and to change over the channel to transmit the next input signal to the output terminal Q1 through the multiplexer 1. Therefore, when fall waveform is not obtained from the comparator 5, the processing circuit 15 cannot proceed to a subsequent processing. That is, while the input voltage Vin is less than (VBE2−VBE1), even if a start signal is issued as shown in FIG. 4(1), the voltage Vc is less than VBE2 as demonstrated in FIG. 4(2), and the stop signal 23 remains at the low level as in FIG. 4(3), so that the processing circuit 15 cannot move to a subsequent processing.

SUMMARY OF THE INVENTION

Accordingly it is an object of the present invention to provide an improved method and apparatus for analog-to-digital conversion.

It is another object of the invention to provide a method and apparatus for analog-to-digital conversion wherein a processing circuit can move to a subsequent operation processing even in the case where an input analog voltage is negative and therefore an analog-to digital conversion cannot be carried out, as well as a method and apparatus for analog-to digital conversion wherein the analog-to-digital conversion can be carried out in the case where the input analog voltage is positive.

To accomplish the above objects, an analog-to-digital converting method in accordance with the invention comprises the steps of actuating a processing circuit to transmit a start signal to a switch to thereby render the switch conductive, applying an analog voltage of input signal to a capacitor via the switch so as to electrically charge the capacitor until a value of charging voltage thereof reaches a specified value corresponding to a level of the input signal, thereafter opening the switch by the start signal so as to cause the capacitor to discharge with a constant current, leading out a level discriminating signal when a voltage of the capacitor decreases to a predetermined level in the course of discharging, generating a stop signal by a logical operation of the start signal and the level discriminating signal, and actuating the processing circuit to calculate a digital value corresponding to a time period from the time that the switch is opened to the time that the stop signal is generated so as to thereafter move to a subsequent procssing operation.

Furthermore, an analog-to-digital converting method in accordance with the invention comprises the steps of actuating a processing circuit to transmit a start signal to a switch to thereby render the switch conductive whereby a capacitor is electrically charged, thereafter opening the switch by the start signal so as to cause the capacitor to discharge with a constant current, leading out a level discriminating signal when a voltage of the capacitor rises up to a level of an analog input signal in the course of charging, generating a stop signal by a logical operation of the start signal and the level discriminating signal, and actuating the processing circuit to calculate a digital value corresponding to a time period from the time that the switch is opened to the time that the stop signal is generated so as to thereafter move to a subsequent processing operation.

In accordance with the invention, since the stop signal is generated as a result of the logical operation of the start signal led out from the processing circuit and the level discriminating signal led out from the level discriminating means, the processing circuit accepts the stop signal and calculates the digital value, and then can move to a processing operation.

In a preferred embodiment, the stop signal is generated by delaying a signal resulted from the logical operation. Consequently, mulfuction of the processing circuit can be prevented because the stop signal is generated after the switch is opened responsive to the start signal.

Besides, an analog-to-digital converter in accordance with the invention comprises input means for receiving an analog input signal, a power source superposing a DC voltage on the analog input signal from the input means in series, a switch conducting/stopping an output from the power source responsive to a start signal received by the switch, a capacitor intergrating the output from the switch, a constant current source causing the capacitor to discharge with a predetermined constant current, means for setting a discriminating level, level discriminating means having one input terminal thereof applied to a voltage of the capacitor and the other input terminal applied to a voltage of a discriminating level from the discriminating level setting means and leading out such a level discriminating signal as to have a predetermined logical value when discharging voltage of the capacitor goes below the discriminating level, logical operation means for performing a logical operation responsive to the start signal and the level discriminating signal and leading out the stop signal when the switch is opened by the start signal and the level discriminating signal has the predetermined logical value, and a processing circuit leading out the start signal, the signal rendering the switch conductive longer than the time required for the voltage of the capacitor to reach a maximum level corresponding to the input signal, and calculating responsive to the stop signal a digital value corresponding to a time period from the time that the switch is opened to the time that the stop signal is received by the processing circuit so as to thereafter move to a subsequent processing operation.

Moreover, an analog-to-dital converter in accordance with the invention comprises input means for receiving an analog input signal, a power source superposing a DC voltage on the analog input signal from the input means in series, a capacitor for integrating, a switch causing capacitor to discharge responsive to a start signal received by the switch, a constant current source electrically charging the capacitor with a predetermined constant current, means for setting a discriminating level, level discriminating means having one input terminal thereof given an output by the power source and the other input terminal applied to a voltage of the capacitor and leading out such a level discriminating signal as to have a predetermined logical value when charging voltage of the capacitor exceeds the voltage of the one input terminal, logical operation means for performing a logical operationg responsive to the start signal and the level discriminating signal and leading out the stop signal when the switch is opened by the start signal and the level discriminating signal has the predetermined logical value, and a processing circuit leading out the start signal, and calculating responsive to the stop signal a digital value corresponding to a time period from the time that the switch is opened to the time that the stop signal is received by the processing circuit so as to thereafter move to a subsequent processing operation.

In another preferred embodiment, there is provided a delay circuit for leading out the stop signal by delaying an output from the logical operation means.

In still another preferred embodiment, the input means is a multiplexer adapted to selectively lead out a plurality of analog input signals responsive to a channel selection signal from the processing circuit and the processing circuit leads out the channel selection signal for selecting the analog input signal after receiving the stop signal.

In yet another preferred embodiment, the logical operation means is an AND gate.

In accordance with the invention, a conversion completion signal is generated which shows that one analog signal is converted into a digital signal by a logic of an analog-to-digital conversion start signal and an output of comparing means, and processing can move to a subsequent converting operation even in the case where an input is irregular, thereby enabling the analog-to-digital converting operation to be performed efficiently.

BRIEF DESCRIPTION OF THE DRAWINGS

These and other objects, features and advantages of the invention will become more apparent upon a reading of the following detailed specification and drawing, in which.

DETAILED DESCRIPTION OF THE PREFERRED EMBODIMENTS

Figure 5:
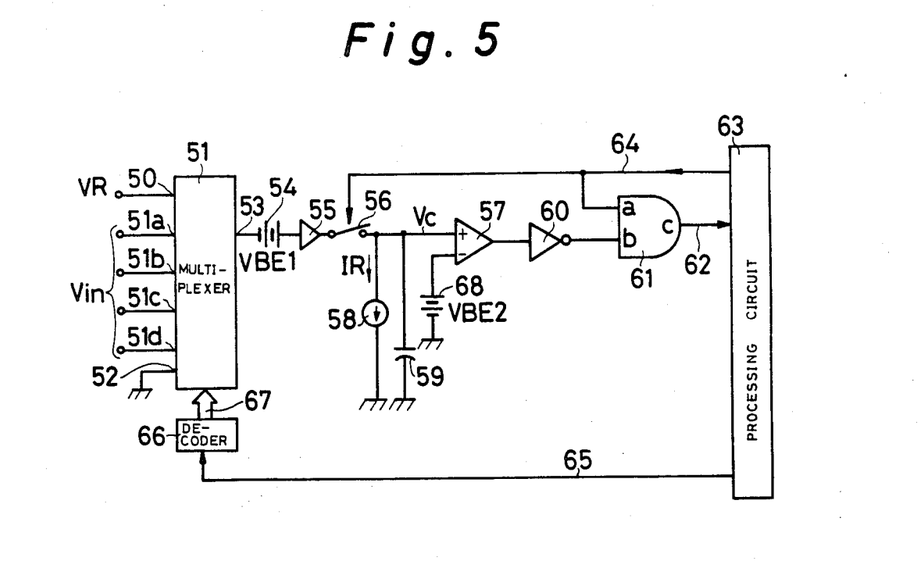
FIG. 5 is an electric current diagram showing an embodiment of the invention.

FIG. 5 is an electric circuit diagram of one of the embodiments of the present invention. A reference voltage VR is applied to an input terminal 50 of a multiplexer 51, and an input voltage Vin, which is an analog voltage, is applied to other input terminals 51a to 51d. An output terminal 53 of the multiplexer 51 is connected to the negative pole of a battery cell 54. The positive pole of the battery cell 54 is connected to one of a switch 56 through a buffer gate 55. A noninverting input terminal of a comparator 57 as a level discriminator means is connected to the other end of the switch 56, and is grounded by way of a constant current circuit 58, and is also grounded through a capacitor 59. The constant current circuit 58 performs the function of causing the capacitor 59 to discharge with a constant current IR. The output terminal of the comparator 57 is intended to lead out a level discriminating signal, and is connected to an input terminal b of an AND gate 61 through a NOT gate 60. An output terminal c of the AND gate 61 is connected to a processing circuit 63 through a line 62,. The processing circuit 63 is connected to an input terminal a of the AND gate 61 through a line 64, and closes and openes a switch 56 by means of a start signal 64a (see FIG. 6 (1) blow) which is transmitted to the line 64. This start signal 64a is a signal for starting the analog-to-digital converting operation, and when the start signal 64a is at a low level, the switch 56 is closed. The processing circuit 63 transmits a channel selection signal which applies input signals VR, and Vin respectively given to input terminals 50, and 51a to 51d of the multiplexer 51 selectively to the output terminal 53, through lines 65 to a decoder circuit 66. The output of the decoder circuit 66 is applied to the multiplexer 51 through a bus line. The processing circuit 63 responds to the rise waveform of stop signal 62a (see FIG. 6) through the line 62 from the AND gate 61, and operates to determine the digital value of the input signal Vin according to Eq. (9) mentioned below, then leads the signal to the line 65 to actuate the multiplexer 51 by means of the decoder 66. In consequence, one of the next input terminals 51a to 51d is rendered conductive selectively to the output terminal 53, while a start signal 64a is delivered from the line 64. This processing circuit 63 counts the number of clock pulses having a specified frequency during the time Tx from the rise of start signal 64a to the rise of stop signal 62a, and stores the counted number during the rise of the stop signal 62a. Using this stored number, the input signal Vin is coded according to Eq. (9) mentioned below, and a digital value thereof is calculated.

W1, which represents a time period of the low level of the start signal 64a, is chosen to be equal to or longer than the time required to electrically charge the capacitor 59 so as to have a value of a voltage 59a thereof reached a specified value during the time W1, which value corresponds to a maximum possible value of the input signal Vin given to the input terminals 51a to 51d. The processing circuit 63 transmits a start signal 64a having such time period W1 of low level to the line 64.

Figure 6:
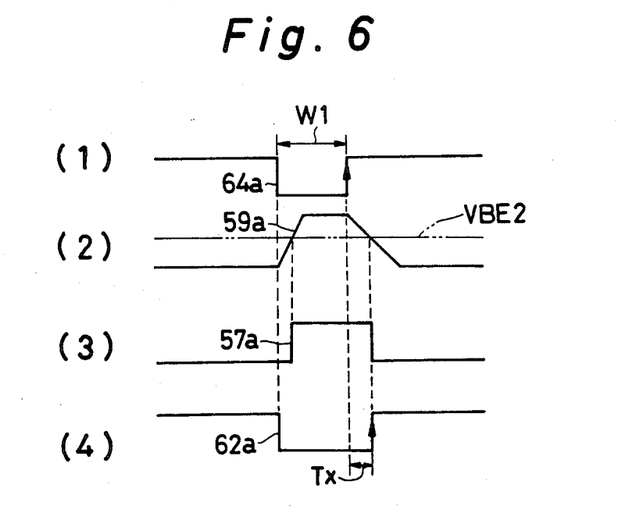
FIGS. 6 and 7 are diagrams of timing chart showing the operation of the electric circuit of FIG. 5.

FIG. 6 is a timing chart when the input voltage applied to input terminals 51a to 51d of the multiplexer 51 is a positive voltage. In the processing circuit 63, when the start signal 64a in FIG. 6 (1) falls, the signal coming from the processing circuit 63 through the line 65 renderes, for example, the input terminal 51a of the multiplexer 51 conductive to the output terminal 53, and the switch 56 is closed by the start signal 64a at this time, so that the voltage Vc of the capacitor 59 rises as indicated by line 59a in FIG. 6 (2) corresponding to the magnitude of input analog voltage Vin and bias voltage VBE1, thereby exceeding the voltage VBE2 of a discriminating level applied to the inverting input terminal of comparator 57. At the fall point of the start signal 64a, the stop signal 62a which is the output of AND gate 61 as shown in FIG. 6 (4) turns from a high level to a low level. The level discriminating signal 57a shown in FIG. 6 (3) which is the output of the comparator 57 turns from a low level to a high level when the voltage Vc of the capacitor 59 exceeds the VBE2. When the start signal 64a returns to the high level after the voltage Vc indicated by line 59a reaches a specified value corresponding to the voltage (Vin+VBE1), the switch 56 is opened, and the voltage Vc of the capacitor 59 declines as indicated by the line 59a. When the voltage Vc becomes lower than the voltage VBE2, the stop signal 57a turns from a high level to a low level. At this time, since the output of the NOT gate 60 turns from a low level to a high level, the stop signal 62a also changes from a low level to a high level. Therefore, by the stop signal 62a applied to the processing circuit 63 from the output terminal c of the AND gate 61 through the line 62, the processing circuit 63 can enter into a subsequent processing operation, that is, an analog-to-digital converting action.

In the processing circuit 63, the time Tx1 from the rise of the start signal 64a to the fall of stop signal 62a is measured, and the input voltage Vin which is an analog voltage applied to the input terminals 51a to 51d of the multiplexer 51 may be calculated in the following equation.

$$(Vin + VBE1 - VBE2) \times C = IR \times Tx1 \quad (6)$$

where C is the capacity of the capacitor 59. When the input voltage Vin is changed over to the reference voltage VR and is delivered to the output terminal 53, the following Eq. (7) is established.

$$(VR + VBE1 - VBE2) \times C = IR \times TR1 \quad (7)$$

where TR1 is a time period from the rise of start signal 64a to the fall of stop signal 62a.

The following Eq. (8) is one relating to the voltage (VBE1 − VBE2) when the VR is 0 volt.

$$(VBE1 - VBE2) \times C = IR \times TO1 \quad (8)$$

where TO1 is a time period from the rise of start signal 64a to the fall of stop signal 62a when the VR is 0 volt.

From the Eqs. (6) to (8), the following Eq. (9) is yielded.

$$\frac{Vin}{VR} = \frac{Tx1 - TO1}{TR1 - TO1} \quad (9)$$

where VR, TR, and TO are predetermined values. Therefore, when the time Tx1 is measured, the digial value of the input voltage Vin may be calculated in Eq. (9).

Figure 7:
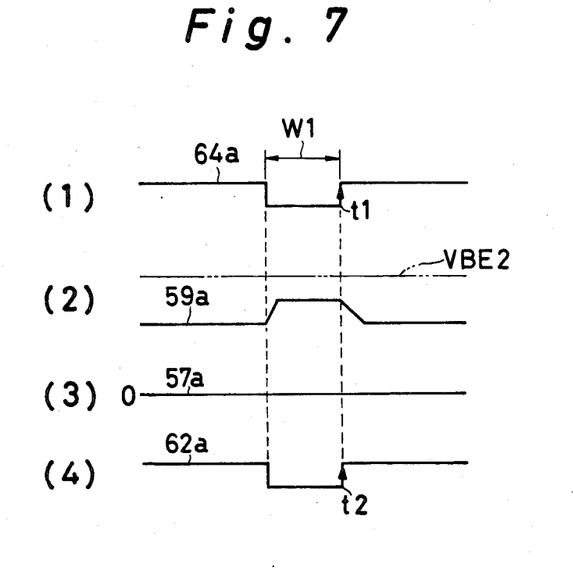

FIG. 7 is a timing chart when the input voltage applied to the multiplexer 51 is a negative voltage. As shown in FIG. 7 (1), when the start signal 64a falls, the voltage Vc of the capacitor 59 ascends as indicated by line 59a in FIG. 7 (2), but does not reach as high as the voltage VBE2. As a result, the stop signal 57a remains at a low level as shown in FIG. 7 (3), but since the output of the NOT gate 60 is still at a high level, the rise waveform of the stop signal 62a is introduced into the line 62 as shown in FIG. 7 (4), and the processing circuit 63 advances toward a subsequent processing operation.

In the embodiment disclosed in FIGS. 5 to 7, as evident from FIG. 7, after the rise time t1 of the start signal 64a, the stop signal 62a rises at time t2 at a very slight time interval. As a result, the processing circuit 63 moves to a subsequent processing operation. Suppose the stop signal 62a rises before the rise time t1 of the start signal 64a due to some cause. In this case, the processing circuit 63, after the time t1, responds to the rise of the start signal 64a and continues to count the time Tx, which poses a new problem.

Figure 8:
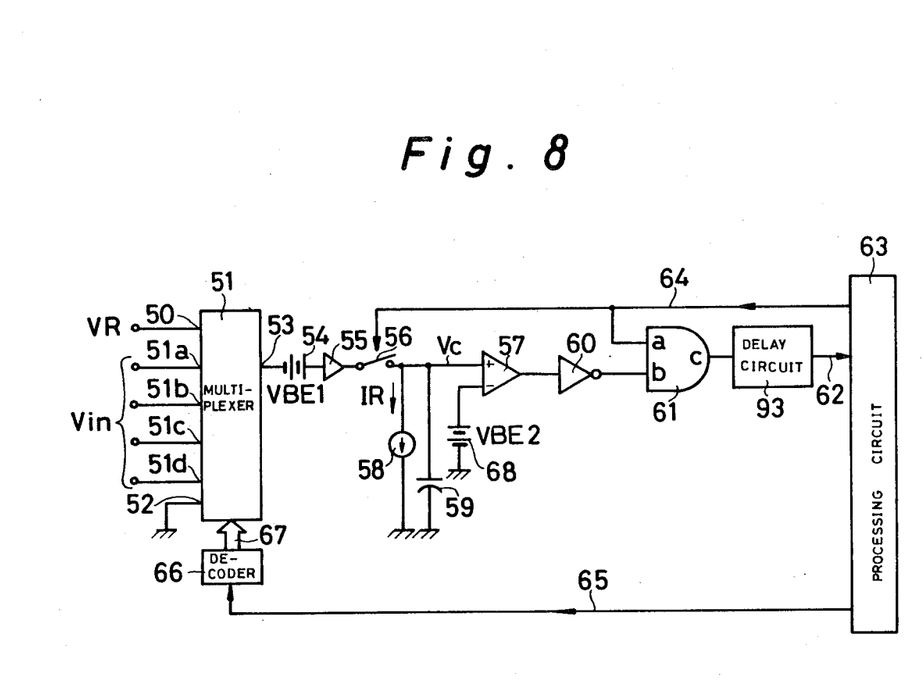
FIG. 8 is an electric circuit diagram showing another embodiment of the invention.

FIG. 8 shows an electric circuit diagram of another embodiment of this invention intended to solve such problem. This embodiment is analogous to that disclosed in FIG. 5, and corresponding parts thereof are given same reference marks.

In the multiplexer 51, a voltage VR is applied to the input terminal 50, and an input voltage of analog signal is given to input terminals 51a to 51d, while a terminal 52 is grounded. The output terminal 53 of the multiplexer 51 is connected to the negative pole of a battery cell 54. The positive pole of the battery cell 54 is connected to one end of a switch 56 through a buffer gate 55. The switch 56 is closed when the start signal 64a (see FIG. 9 (1) below) from the line 64 is at a low level. The noninverting input terminal of a comparator 57 is connected to the other end of the switch 56, and is grounded through a constant current source 58, and is further grounded through a capacitor 59. The inverting input terminal of the comparator 57 is connected to the positive pole of a battery cell 68. The output terminal of the comparator 57 is connected to an input terminal b of an AND gate 61 through a NOT gate 60. An output terminal c of the AND gate 61 connected to a processing circuit 63 through a delay circuit 93 and a line 62.

From the processing circuit 63, a channel selection signal is applied to a decoder circuit 66 through lines 65. This channel selection signal is intended to select an input signal Vi applied to input terminals 50, and 51a to 51d of the multiplexer 51. The decoder circuit 66 is connected to the multiplexer 51 through a bus line 67. The processing circuit 63 is connected to input terminal a of the AND gate 61 by way of a line 64. The start signal from the line 64 to initiate an analog-to-digital converting performance closes the switch 56 when it is at a low level.

Figure 9:
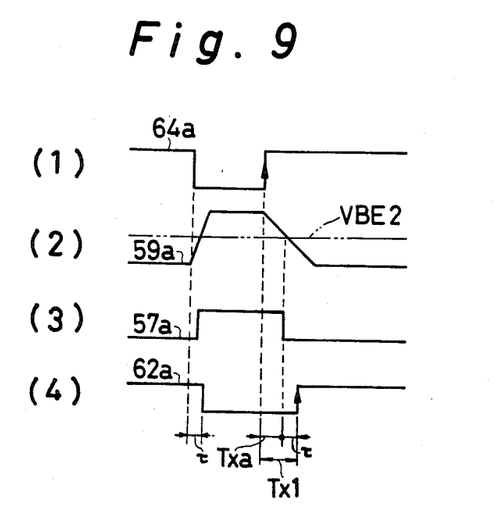
FIGS. 9 and 10 are diagrams of timing chart explaining the operation of the electric circuit of FIG. 8.

FIG. 9 is a timing chart explaining the operation when the input voltage applied to the multiplexer 51 is a positive voltage. A start signal 64a shown in FIG. 9 (1) is sent out from the processing circuit 63, and the voltage of the capacitor 59 is elevated, as indicated by line 59a in FIG. 9 (2), with the fall of the start signal 64a. When this line 59a exceeds the voltage VBE2, the signal 57a which is an output of the comparator 57 turns from a low level to a high level as shown in FIG. 9 (3). This signal 57a is inverted by the NOT gate 60, and the "AND" with the start signal 64a is obtained, and the signal 57a is delayed by means of the delay circuit to produce a stop signal 62a. Therefore, the stop signal 62a changes from a high level to a low level being delayed by the time τ from the start signal 64a as shown in FIG. 9 (4).

When the start signal 64a turns again from a low level to a high level, the voltage Vc of the capacitor 59 indicated by line 59a in FIG. 9 (2) declines. When this voltage Vc decreases to the voltage VBE2, an auxiliary signal 57a turns from a high level to a low level. The stop signal 62a turns from a low level to a high level being delayed by the time τ from the stop signal 57a. By this stop signal 62a, the processing circuit 63 can enter into a subsequent processing operation.

In this case, the time data Tx1 necessary for conversion shown in Eq. (9) is the sum of the true value Txa and the delay time τ. Meanwhile, since each of terms Tx1, TR1, and TO1 of the right member of Eq. (9) is sum of true value and delay time τ, this delay time τ is canceled to be null. Therefore, if time Tx1 comprising ture value Txa and delay time τ is measured, it will not exert a bad influence to the result of conversion, so that an accurate digital value corresponding to the input analog voltage may be calculated.

Figure 10:
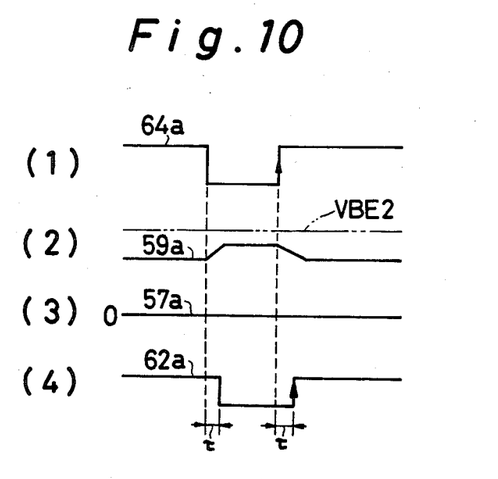

FIG. 10 is a timing chart explaining the operation when the input voltage applied to the multiplexer 51 is a negative voltage. At the point of fall of the start signal 64a shown in FIG. 10 (1), the voltage Vc of the capacitor 59 indicated by line 59a in FIG. 10 (2) is elevated, but this voltage does not rise up to the voltage VBE2. Therefore, as shown in FIG. 10 (3), the signal 57a remains at a low level. On the other hand, as shown in FIG. 10 (4), the stop signal 62a turns from a high level to a low level being delayed by time τ from the fall of the start signal 64a. Similarly, the stop signal 62a changes from a low level to a high level being delayed by the time τ from the rise of the start signal 64a.

Thus it is evident that the rise waveform of stop signal 62a will be obtained after the rise of start signal 64a, so that malfunction of the processing circuit may be prevented.

In the embodiment disclosed in FIGS. 5 to 10, if there is any fluctuation in the input signal Vin, a signal corresponding to the averaged value of fluctuations of the input signal Vin may be obtained by the charging of the capacitor 59. Therefore, the input signal Vin may be accurately converted into a digital value.

Figure 11:
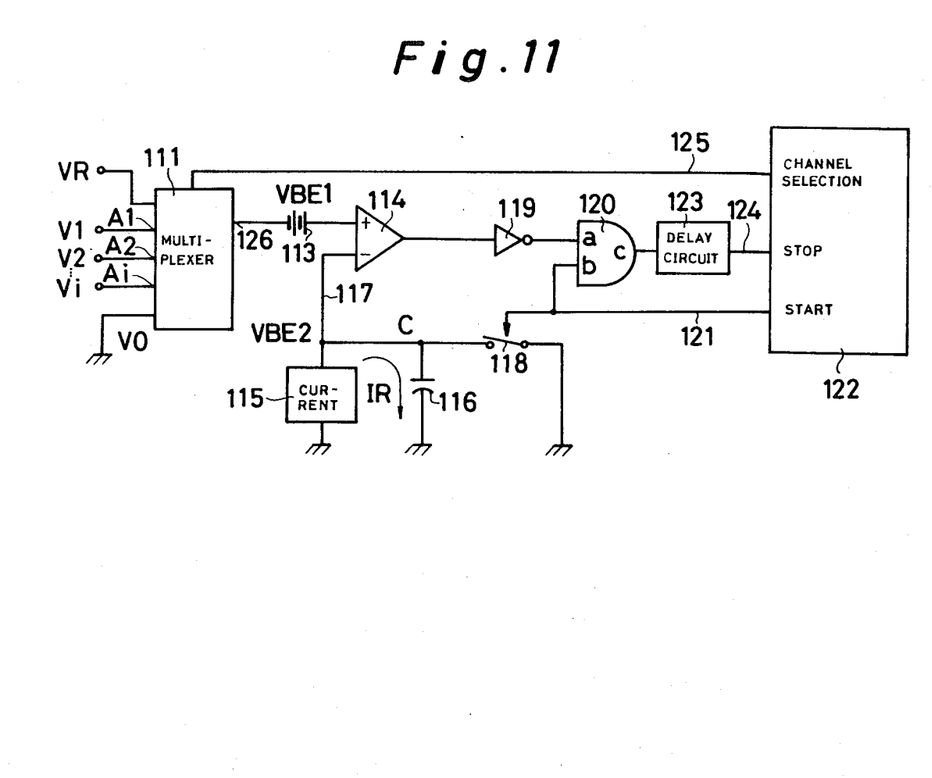
FIG. 11 is an electric circuit diagram showing still another embodiment of the invention.

FIG. 11 shows still another embodiment of this invention. It is particularly noted that a capacitor 116 is charged with a constant current IR. Input voltages V1 to Vi, each of which is an analog signal, are respectively applied to input terminals A1 to Ai of a multiplexer 111. An output terminal 126 of the multiplexer 111 is connected to the negative pole of a battery cell 113, of which positive pole is connected to a noninverting input terminal of a comparator 114. The inverting input terminal of the comparator 114 is connected to a constant current circuit 115, one end of the capacitor 116, and one end of a switch 118 through a line 117. The other end of the capacitor 116 and the other end of the switch 118 are grounded. The output terminal of the comparator 114 is connected to an input terminal a of an AND gate 120 through a NOT gate 119. A start signal 121a (see FIGS. 12 and 13) from a processing circuit 122 is applied to an input terminal b of the AND gate 120 through a line 121. This start signal drives the switch 118, and while the start signal is at a low level, the switch 118 is closed. From an output terminal c of the AND gate 120, a stop signal is transmitted to a delay circuit 123 and a line 124, and this stop signal is applied to the processing circuit 122. From the processing circuit 122, a channel selection signal is applied to the multiplexer 111 through lines 125.

This processing circuit 122 is arranged analogously to the processing circuit 63 in the preceding embodiments.

Figure 12:
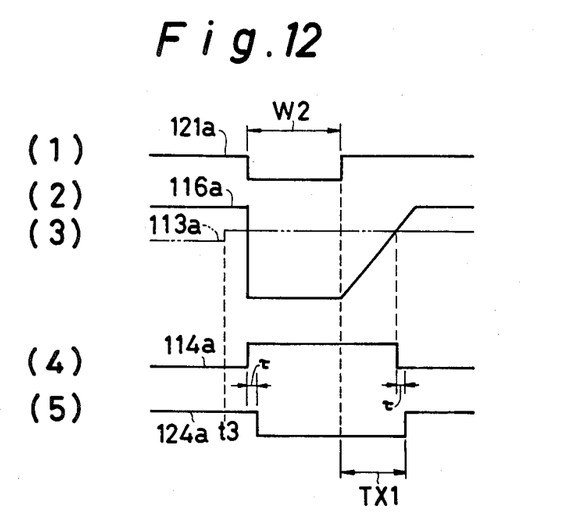
FIGS. 12 and 13 are diagrams of timing chart explaining the operation of the electric circuit of FIG. 11.

FIG. 12 is a timing chart to explain the operation of the circuit in FIG. 11 when the input voltages V1 to Vi respectively applied to the input terminals A1 to Ai of the multiplexer 111 are at such a level as to enable the comparator 114 in FIG. 11 to perform the comparing operation. As shown in FIG. 12 (1), since the switch 118 is closed during the fall of the start signal 121 which is kept at a low level only for a time period W2, the voltage of the capacitor 116 turns from a high level to a low level as indicated by a line 116a in FIG. 12 (2). The comparator 114 compares the signal 113a applied to the noninverting input terminal as shown in FIG. 12 (3) with the voltage level indicated by line 116a applied to the inverting input terminal. As a result, an auxiliary signal 114a as shown in FIG. 12 (4) is transmitted from the comparator 114. From the delay circuit 123, a stop signal 124a shown in FIG. 12 (5) is applied to the processing circuit 122 through a line 124.

At the time t3 shown in FIG. 12 (3), the multiplexer 111 changes over the connection between one of the input terminals A1 to Ai and the output terminal 126 so as to carry out the channel selection. In FIG. 12, the operation is explained in relation to the input signal fed to one of the input terminals A1 to Ai after time t3, and the signal indicated by reference code 113a possesses a value corresponding to the input signal.

Figure 13:
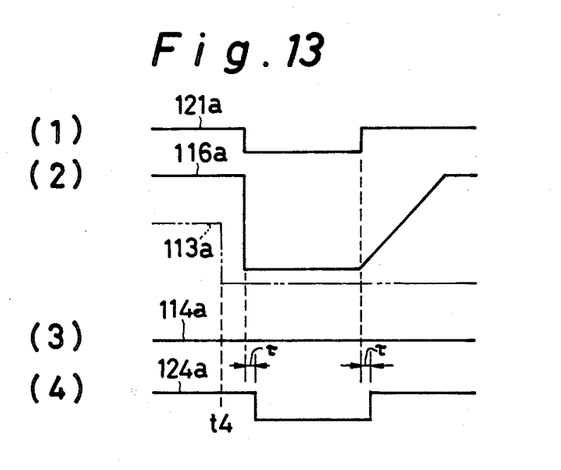

FIG. 13 is a timing chart to explain the operation when the input voltage applied to input terminals A1 to Ai of the multiplexer 111 is a negative voltage. In FIG. 13 (1), waveform of start signal 121a is shown. The comparator 114 compares the voltage of the line 116a indicated in FIG. 13 (2) with the level of signal 113a corresponding to the signal fed by the channel selection operation in the multiplexer 111 at time t4. In this case, the level of the signal 113a is lower than the voltage indicated by line 116a. Therefore, as shown in FIG. 13 (3), an auxiliary signal 114a which is an output of the comparator 114 remains at a low level. Even if the auxiliary signal 114a remains at the low level, a stop signal 124a being delayed by time $\tau$ from the auxiliary signal 114a as shown in FIG. 13 (4) is transmitted to a line 124. As a result, the processing circuit 122 can move to a subsequent processing operation. Hence, the input voltages V1 to Vi selected by the channel selection signal transmitted to the multiplexer 111 from the processing circuit 122 through lines 125 are sequentially converted into digital voltages.

In the embodiment disclosed in FIGS. 11 through 13, by keeping the start signal 121a at a low level, the time period W2 required to discharge the capacitor 116 may be set in a shorter length. Therefore it is advantageous in that the time required for analog-to-digital converting operation may be shortened.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An analog-to-digital converting method comprising the steps of:
   actuating a processing circuit to transmit a start signal to a switch to thereby render the switch conductive;
   applying an analog voltage of input signal to a capacitor via the switch so as to electrically charge the capacitor until a value of charging voltage thereof reaches a specified value corresponding to a level of the input signal;
   thereafter opening the switch by the start signal so as to cause the capacitor to discharge with a constant current;
   leading out a level discriminating signal when a voltage of the capacitor decreases to a predetermined level in the course of discharging;
   generating a stop signal by a logical operation of the start signal and the level discriminating signal; and
   actuating the processing circuit to calculate a digital value corresponding to a time period from the time that the switch is opened to the time that the stop signal is generated so as to thereafter move to a subsequent processing operation.

2. An analog-to-digital converting method comprising the steps of:
   actuating a processing circuit to transmit a start signal to a switch to thereby render the switch conductive whereby a capacitor is electrically discharged;
   thereafter opening the switch by the start signal so as to cause the capacitor to discharge with a constant current;
   leading out a level discriminating signal when a voltage of the capacitor rises up to a level of an analog input signal in the course of charging;
   generating a stop signal by a logical operation of the start signal and the level discriminating signal; and
   actuating the processing circuit to calculate a digital value corresponding to a time period from the time that the switch is opened to the time that the stop signal is generated so as to thereafter move to a subsequent processing operation.

3. An analog-to-digital converting method as claimed in claim 1, wherein the stop signal is generated by delaying a signal resulted from the logical operation.

4. An analog-to-digital converting method as claimed in claim 2, wherein the stop signal is generated by delaying a signal resulted from the logical operation.

5. An analog-to-digital converter comprising;
input means for receiving an analog input signal;
a power source superposing a DC voltage on the analog input signal from the input means in series;
a switch conducting/stopping an output from the power source responsive to a start signal received by the switch;
a capacitor intergrating the output from the switch;
a constant current source causing the capacitor to discharge with a predetermined constant current;
means for setting a discriminating level;
level discriminating means having one input terminal thereof applied to a voltage of the capacitor and the other input terminal applied to a voltage of a discriminating level from the discriminating level setting means and leading out such a level discriminating signal as to have a predetermined logical value when discharging voltage of the capacitor goes below the discriminating level;
logical operation means for performing a logical operation responsive to the start signal and the level discriminating signal and leading out the stop signal when the switch is opened by the start signal and the level discriminating signal has the predetermined logical value; and
a processing circuit leading out the start signal, the signal rendering the switch conductive longer than the time required for the voltage of the capacitor to reach a maximum level corresponding to the input signal, and calculating responsive to the stop signal a digital value corresponding to a time period from the time that the switch is opened to the time that the stop signal is received by the processing circuit so as to thereafter move to a subsequent processing operation.

6. An analog-to-digital converter as claimed in claim 5, wherein there is provided a delay circuit for leading out the stop signal by delaying an output from the logical operation means.

7. An analog-to-digital converter as claimed in claim 5, wherein the input means is a multiplexer adapted to selectively lead out a plurality of analog input signals responsive to a channel selection signal from the processing circuit and the processing circuit leads out the channel selection signal for selecting the analog input signal after receiving the stop signal.

8. An analog-to-digital converter as claimed in claim 5, wherein the logical operation means is an AND gate.

9. An analog-to-digital converter comprising;
input means for receiving an analog input signal;
a power source superposing a DC voltage on the analog input signal from the input means in series;
a capacitor for integrating;
a switch causing capacitor to discharge responsive to a start signal received by the switch;
a constant current source electrically charging the capacitor with a predetermined constant current;
means for setting a discriminating level;
level discriminating means having one input terminal thereof given an output by the power source and the other input terminal applied to a voltage of the capacitor and leading out such a level discriminating signal as to have a predetermined logical value when charging voltage of the capacitor exceeds the voltage of the one input terminal;
logical operation means for performing a logical operation responsive to the start signal and the level discriminating signal and leading out the stop signal when the switch is opened by the start signal and the level discriminating signal has the predetermined logical value; and
a processing circuit leading out the start signal, and calculating responsive to the stop signal a digital value corresponding to a time period from the time that the switch is opened to the time that the stop signal is received by the processing circuit so as to thereafter move to a subsequent processing operation.

10. An analog-to-digital converter is claimed in claim 9, wherein there is provided a delay circuit for leading out the stop signal be delaying an output from the logical operation means.

11. An analog-to-digital converter as claimed in claim 9, wherein the input means is a multiplexer adapted to selectively lead out a plurality of analog input signals responsive to a channel selection signal from the processing circuit and the processing circuit leads out the channel selection signal for selecting the analog input signal after receiving the stop signal.

12. An analog-to-digital converter as claimed in claim 9, wherein the logical operation means is an AND gate.

* * * * *